United States Patent
Schneider et al.

(10) Patent No.: US 8,273,221 B2
(45) Date of Patent: Sep. 25, 2012

(54) SPUTTER TARGET UTILIZATION

(75) Inventors: Stefan Schneider, Valens (CH); Marcel Muller, St. Gallen (CH); Jiri Vyskocil, Praha (CZ); Israel Wagner, Sargans (CH)

(73) Assignee: Oerlikon Solar AG, Trubbach, Trubbach (CH)

( * ) Notice: Subject to any disclaimer, the term of this patent is extended or adjusted under 35 U.S.C. 154(b) by 1012 days.

(21) Appl. No.: 11/638,176

(22) Filed: Dec. 13, 2006

(65) Prior Publication Data

US 2007/0175749 A1    Aug. 2, 2007

Related U.S. Application Data

(60) Provisional application No. 60/749,789, filed on Dec. 13, 2005.

(51) Int. Cl.
*C23C 14/00* (2006.01)
(52) U.S. Cl. ........... 204/192.1; 204/298.16; 204/298.17; 204/298.19; 204/298.2; 204/192.38
(58) Field of Classification Search ............. 204/298.16, 204/298.17, 298.19, 298.2, 192.1, 192.38
See application file for complete search history.

(56) References Cited

U.S. PATENT DOCUMENTS

| | | |
|---|---|---|
| 3,956,093 A | 5/1976 | McLeod |
| 4,356,073 A | 10/1982 | McKelvey |
| 4,466,877 A | 8/1984 | McKelvey |
| 4,600,492 A | 7/1986 | Ooshio et al. |
| 5,026,471 A | 6/1991 | Latz |
| 5,160,595 A | 11/1992 | Hauzer |
| 5,399,253 A | 3/1995 | Grunenfelder |
| 6,322,679 B1 * | 11/2001 | De Bosscher et al. ..... 204/298.2 |
| 2005/0061666 A1 | 3/2005 | Gupta |

FOREIGN PATENT DOCUMENTS

| | | |
|---|---|---|
| DE | 2417288 A1 | 8/1975 |
| DE | 2707144 A1 | 8/1977 |
| EP | 0065277 A1 | 11/1982 |
| EP | 0070899 B1 | 7/1987 |
| EP | 0416241 A2 | 3/1991 |
| EP | 0459137 A2 | 12/1991 |
| EP | 0503138 A1 | 9/1992 |
| EP | 0603587 A1 | 6/1994 |
| EP | 0603587 B1 | 9/1996 |
| EP | 1063679 A1 | 12/2000 |
| JP | 57 047870 A | 3/1982 |
| JP | 61-295368 | 12/1986 |
| JP | 61 295368 A | 12/1986 |
| JP | 61295369 | 12/1986 |
| JP | 02030757 | 2/1990 |
| JP | 04276069 | 10/1992 |

OTHER PUBLICATIONS

International Search Report dated Mar. 28, 2007.

\* cited by examiner

*Primary Examiner* — Keith Hendricks
*Assistant Examiner* — John Brayton
(74) *Attorney, Agent, or Firm* — Pearne & Gordon LLP

(57) ABSTRACT

An apparatus and method are provided for improved utilization of a sputter target in the longitudinal end regions. The focus of erosion in the end regions is widened, thereby extending the useful life of the target. This provides improved efficiency and reduces waste because a greater proportion of the target material in the more expansive central region can be harvested, because the target is utilized for a longer period of time.

14 Claims, 5 Drawing Sheets

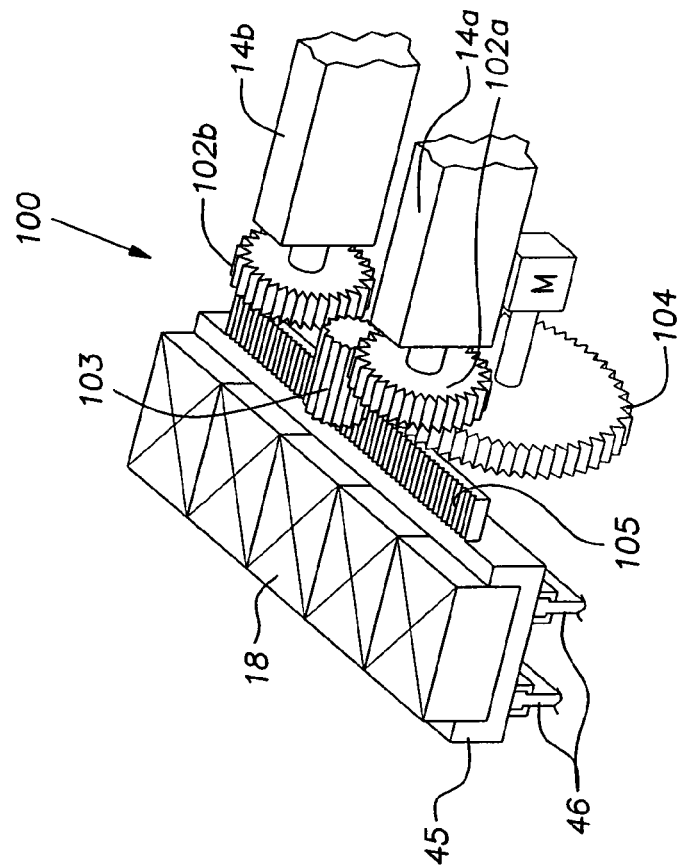
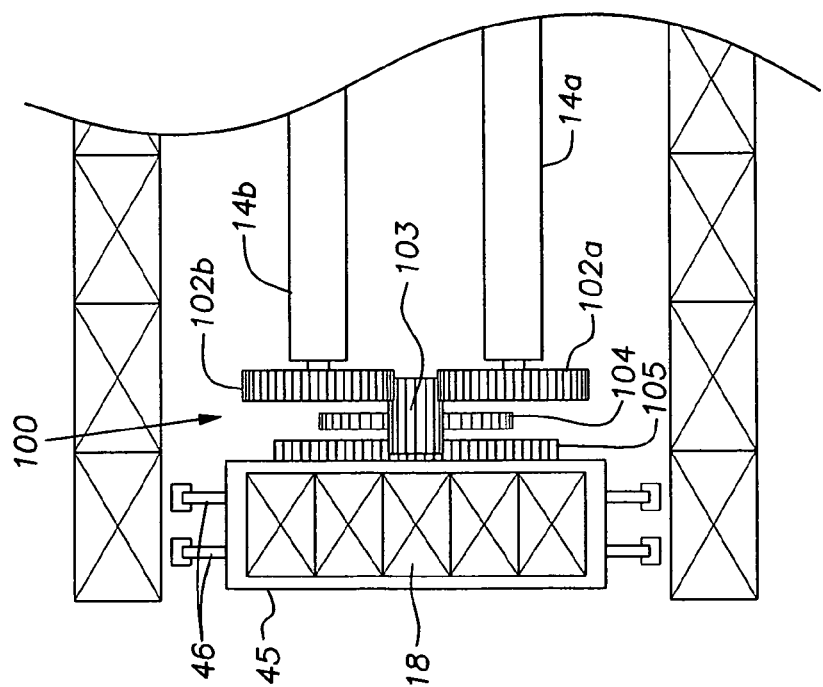

SPUTTER TARGET UTILIZATION

This application claims the benefit of U.S. provisional patent application Ser. No. 60/749,789 filed Dec. 13, 2005, the contents of which are incorporated herein by reference in their entirety.

BACKGROUND OF THE INVENTION

1. Field of the Invention

The invention relates to improved target utilization in plasma sputtering or sputter etching operations. More particularly, it relates to improved, more uniform utilization of the sputtering source material (i.e. the sputter 'target'), so that a greater proportion of that source material can be utilized to coat substrates.

2. Description of Related Art

Sputter coating apparatus are known generally. In a typical apparatus, an energy discharge is used to excite the atoms of an inert gas, e.g. argon, to form an ionized gas or plasma. The energetic plasma is directed (accelerated) toward the surface of a sputter target by application of a magnetic field. The sputter target typically is provided in the form of a rectangular slab or sheet or plate. The plasma bombards the surface of the target, thus eroding that surface and liberating target material. The liberated target material then can be deposited onto a substrate, such as metal or plastic or glass, to provide a thin-film coating of the target material on the substrate. This process is also sometimes referred to as magnetron sputtering, due to the use of a magnetic field to support the plasma discharge.

To generate the plasma from the ground-state gas, such as argon, a cathode is applied with a negative voltage in a vacuum chamber; a separate electrode or the vacuum chamber itself may serve as anode. This way a plasma discharge is maintained by an inert gas such as argon or a mixture of inert gases with reactive gases. In one construction, e.g. illustrated in U.S. Pat. No. 5,399,253, which is assigned to the assignee of the present application, the sputter target itself is provided as the cathode. This ensures the plasma is efficiently generated immediately above the sputter target surface. Also shown in the '253 patent, the magnetic field used to direct the plasma is or can be generated by a series of magnets located behind the sputter target (cathode), facing a rear surface of the target opposite the surface where the plasma will bombard the target.

To promote more uniform erosion of the target, longitudinally-extending magnets, which extend parallel to the long axis of the target, can be moved laterally or otherwise rotated about their longitudinal axes in order to shift resulting magnetic fields laterally relative to the target; that is, in a direction that is perpendicular to the long axis of the target. The '253 patent discloses one embodiment for doing this. In that patent, a pair or pairs of oppositely-oriented (referring to their polar orientation) and longitudinally-extending permanent magnets are disposed substantially coplanar with and located within an outer permanent magnet frame that does not move. These magnets, which extend in a direction parallel to the long axis of the target, are rotatable about their respective longitudinal axes. As described in more detail in the '253 patent, the rotation of these magnets within the outer permanent magnet frame causes lateral shifting of the correspondingly induced magnetic fields ('tunnel' magnetic fields) at the opposite surface of the sputter target, which in turn produces more uniform plasma bombardment of that surface in the lateral direction.

But this lateral shifting of the magnetic field has virtually no effect on the portion of the plasma that bombards the longitudinal end regions of the target. This is because the longitudinally-extending magnets mentioned above do not extend the full length of the target, so their rotation has little effect on the magnetic fields in the end regions. Moreover, because the outer magnet frame does not move, the magnetic fields adjacent the longitudinal end regions of the target are relatively stagnant compared to those located in the central region of the target, which shift laterally based on rotation of the magnets as already explained. The result is that plasma bombardment in the longitudinal end regions of the target is relatively focused compared to in the central region, located between the end regions. Consequently, there tends to be relatively deep, focused erosion in the end regions, compared to the relatively more uniform erosion in the central region of the target.

The sputter target in a sputtering operation is typically replaced as soon as or before it is completely eroded (i.e. penetrated) at any location. Because relatively more focused erosion occurs in the end regions, where the magnetic fields and consequently the plasma bombardment paths are stagnant, the entire target plate usually is replaced long before erosion from the center region would warrant replacement. The result is that a substantial amount of sputter source material in the target plate is wasted, because the plate is replaced early enough so that deep erosion in the end regions does not penetrate the target. Alternatively, a step-wise target plate structure has been employed, where the target plate is relatively thicker in the end regions than in the central region. This way, the more focused erosion in the end regions is accommodated by a thicker target in those regions, and a greater proportion of the central-region material can be used because the target plate can be employed for a longer period of time. However, this step-wise structure also is undesirable. For one thing, it also results in wasted material—this time in the end regions. Another disadvantage is, that manufacturing such target is costly and that the effort for target exchange is increased.

As will be appreciated by those of ordinary skill in the art, in a conventional sputtering apparatus the strongest (deepest) point of erosion contributes relatively little of the total material sputtered from the target. Nevertheless, this point often determines the lifetime and therefore the maximum target utilization of the entire target.

Consequently, there is a need in the art to provide more uniform erosion from the end regions of a sputter target, and not just to the central region located between the end regions. Preferably, erosion (namely the depth of erosion) will be achieved both in the end regions and the central region at more nearly the same rate than using conventional equipment.

SUMMARY OF THE INVENTION

A sputtering apparatus includes a magnetic assembly over which a sputter target having a central region and two end regions located at either end of said central region is to be disposed during operation. The magnetic assembly is effective to generate a magnetic field above the target. The magnetic assembly has an outer magnet frame surrounding a central magnet arrangement. The outer magnet frame includes first and second longitudinally extending magnetic lateral members located on either side of the central magnetic arrangement, and first and second magnetic end members located at and defining opposite longitudinal ends of the frame. The first magnetic end member is effective to generate a nonstatic modulation in the magnetic field above a first longitudinal end region of the target.

A sputtering method includes the steps of: providing a sputter target having a target surface that has a central region and first and second longitudinal end regions located at either end of the central region, generating a magnetic field above the target surface, directing a plasma toward the target surface via the magnetic field, wherein the plasma thereby bombards and erodes the target surface, and modulating the magnetic field above the first end region of the target surface, thereby widening a focus of erosion of the target in the first end region thereof.

BRIEF DESCRIPTION OF THE DRAWINGS

FIG. 3 is a plan view showing a laterally-slidable carriage for a magnetic end assembly as described herein, coupled to a common drive mechanism that also rotates magnetic bars of a central magnetic arrangement.

FIG. 3*a* is a perspective view illustrating the drive mechanism of FIG. 3.

DETAILED DESCRIPTION OF PREFERRED EMBODIMENTS

As used herein, the terms 'magnet' and 'magnetic member' include both conventional permanent magnets as known in the art, as well as any other known or conventional structure or device that is effective to generate a magnetic pole and corresponding magnetic field; for example a field coil or a conventional electromagnet.

Erosion in the longitudinal end regions of the sputter target is made more uniform, and overall target utilization improved, through modulation of the magnetic fields (or the portion thereof located in the end regions of the target. This modulation can be achieved by providing adjacent the end regions of the target either a series of permanent magnets having a time-dependent motion, or an electromagnet whose power can be varied with time to generate a field of variable strength. In a further alternative, a combination of these two methodologies could be used.

In the embodiment described below, the ends of the outer permanent magnet frame are replaced with a permanent magnet (or series of magnets) that can be moved laterally relative to the target; i.e. perpendicular to the long axis of the target. These movable magnets in the end regions of the target are effective to modulate the magnetic field in the longitudinal end regions of the target, and therefore the plasma paths in the end regions, where the movement or rotation of the longitudinally-extending magnetic bars in the conventional apparatus have little effect. Following is a description of an exemplary embodiment of the present invention.

Figure 1:
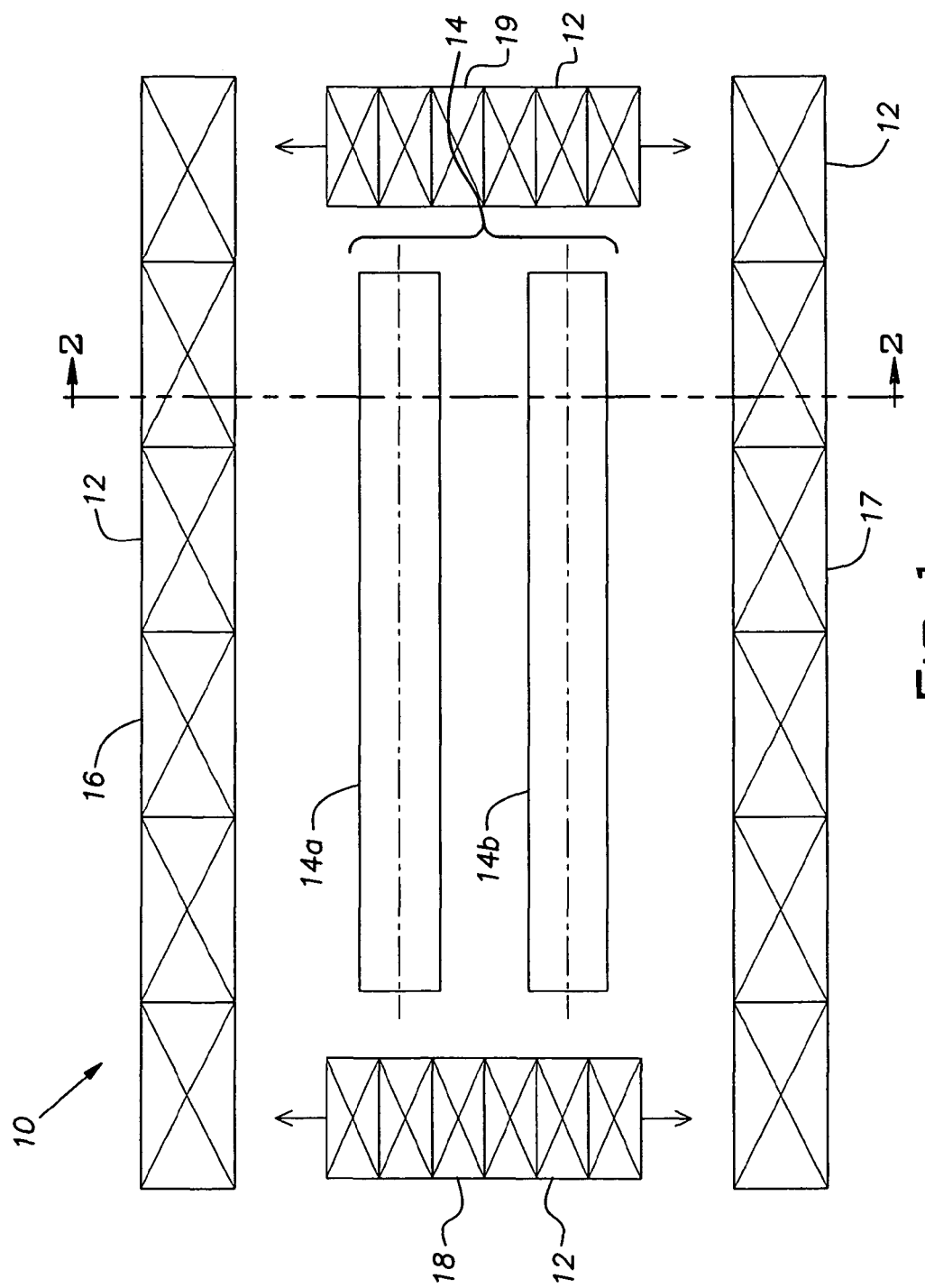
FIG. 1 is a plan view of a magnetic assembly according to an embodiment of a sputtering apparatus disclosed herein.
Figure 2:
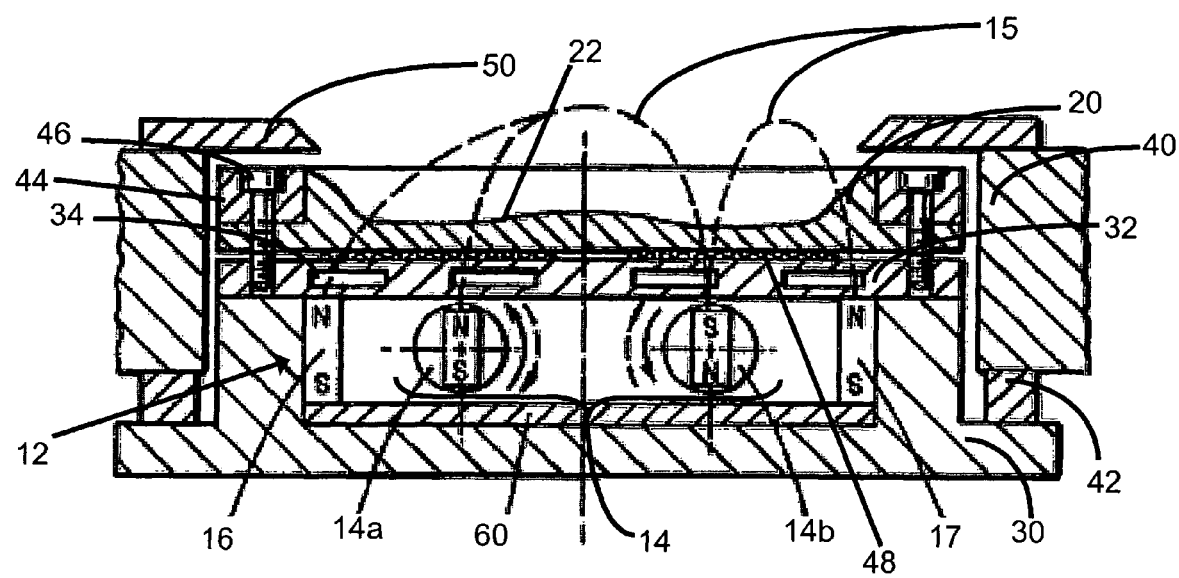
FIG. 2 is a cross-section taken along line 2-2 in FIG. 1, showing not only the magnetic assembly but also other components of the sputtering apparatus that are not illustrated in FIG. 1.

FIG. 1 shows a plan view of a magnetic assembly 10 for a sputtering apparatus. FIG. 2 shows a cross-sectional view of a sputtering apparatus incorporating the magnetic assembly 10 of FIG. 1. As seen from FIG. 2, the magnetic assembly 10 is to be located generally underneath the sputter target 20 relative to the surface 22 that will be bombarded by the plasma during operation. Typically, the sputter target 10 is provided as (or as part of) the cathode for generating the plasma discharge that excites the ground-state inert gas to produce plasma. Such configuration is assumed in the present embodiment, though that is not necessarily required. Returning to the above-mentioned figures, the cathode assembly includes a housing 30, a cooling plate 32 with cooling channels 34 and the target 20. The entire assembly is flanged on a vacuum chamber 40, for example by means of tightenable isolation means 42. The sputtering target 20 is pressed against the cooling plate 32 by means of a holding frame 44 with screws 46 and a contact foil 48. The vacuum chamber, in addition, is fitted with a shield 50, which in this embodiment at the same time forms the anode and is placed so that it peripherally embraces the cathode assembly but does not contact it. The entire configuration, for instance, is constructed as a rectangle where the target, for example, is of a typical size of 145×450 mm. Behind the cooling plate 32 is placed the magnetic assembly 10, which is illustrated in plan view in FIG. 1.

The magnetic assembly 10 includes an outer magnet frame 12 encircling or surrounding a central magnet arrangement 14 as will be further described, to produce a tunnel-like magnetic field or fields 15 that go(es) through the cooling plate 32 and the target 20, thus forming a ring-like electron trap(s) above the exposed target surface 22. On the back side, the magnetic assembly 10 is provided with a pole plate 60 of ferromagnetic material in order to close the backside magnetic field flow. To produce a plasma discharge, a negative voltage is applied to the cathode body 30 or the target 20, respectively, in relation to the anode 50. (Alternatively, the cathode can be operated with an AC power supply within the range of several 100 Hz to kHz of middle or high frequency. Combinations or overlappings of AC and DC sources are also possible).

The central magnet arrangement 14 preferably includes a pair of longitudinally extending and oppositely polar-oriented bar magnets that are rotatable about their respective longitudinal axes. This is best seen with reference to FIGS. 2 and 3*a*. By 'oppositely polar-oriented,' it is meant that the first magnet in a pair, e.g. magnet 14*a*, is oriented so that its North pole faces upward, toward the target 20, when the second magnet in the pair, e.g. magnet 14*b*, is oriented so that its North pole faces downward, away from the target 20. That is, the magnets 14*a* and 14*b* in a pair are arranged for rotation about their respective longitudinal axes so that their common poles (North or South) are always facing opposite directions, across their entire rotational range. The central magnetic arrangement 14 can have one pair of magnets 14*a* and 14*b* as shown in FIG. 2, or it can have multiple pairs of oppositely oriented magnets. The magnets of the central magnetic arrangement 14 are rotatable so that the tunnel magnetic fields 15 can be shifted laterally with respect to the target surface as explained above, and in further detail in U.S. Pat. No. 5,399,253, which is incorporated herein by reference in its entirety. However, they have little effect on the magnetic field in the longitudinal end regions of the target, as also already explained. The operation (rotation) of the magnets in the central magnetic arrangement 14 is already described in . detail in the '253 patent, and will not be further described here. In addition to rotatable magnets 14a, 14b, alternative arrangements can be employed in the central magnetic arrangement 14 to achieve the lateral shift in the magnetic field mentioned above. For example, non-rotatable permanent magnets can be translated in a lateral direction, back and forth, with similar effect, although the rotatable configuration is preferred.

Referring again to FIG. 1, the outer magnetic frame 12 includes first and second longitudinally extending magnetic lateral members 16 and 17, located on either side of the central magnetic arrangement 14. The outer magnetic frame 12 also includes first and second magnetic end members 18 and 19 located at the opposite longitudinal ends of the frame 12. Together, the magnetic lateral and end members 16, 17, 18 and 19 define that frame 12, which substantially encircles the central magnetic arrangement 14. The magnetic end members 18 and 19 are so-called because they are located underneath the target 20, under its respective longitudinal end regions where operation of the central magnetic arrangement 14 has little or no effect on the magnetic field. The magnetic end members 18,19 are movable, preferably in at least a lateral direction as indicated by the arrows in FIG. 1. During operation, the lateral movement of the end members 18, 19 is effective to produce a modulation in the magnetic field above the longitudinal end regions of the target 20 (above surface 22), to thereby modulate the path of the plasma on the target surface 22. In this manner, the plasma bombardment is no longer focused along a fixed path in the end regions. Consequently, erosion of the target in these regions is more uniformly spread out. The result is that the rate of erosion (depth) in the end regions is caused to approach that in the central region, meaning the target can be utilized for a longer period of time. This is a substantial advantage, because it permits more complete erosion (use) of the target in the central region, whose surface area is far greater than in the end regions. As a result, a substantially greater total proportion of the target material can be harvested and utilized for sputter-coating a substrate.

The lateral movement of the magnetic end members 18 and 19 can be achieved by any conventional or suitable means, the exact structure of which is not critical. For example, they may be coupled to the drive means used to drive (rotate) the rotary magnets 14a and 14b, such as through a tooth bar and gear arrangement. One such embodiment is shown in FIGS. 3 and 3a. In that embodiment, the magnetic end member 18 is provided on a carriage 45 that is slidably carried on one or a series of laterally-extending tracks 46. In this embodiment, the movement of the carriage is linked to the drive mechanism 100 for the rotating magnets 14a and 14b. As seen in the figures, each rotary magnet 14a, 14b is linked to a respective magnet drive gear 102a, 102b. The magnet drive gears 102a, 102b are operatively engaged with a transfer gear 103, which in turn is operatively engaged with a drive gear 104. The drive gear 104 is linked to a drive mechanism, such as a drive motor or servo M (shown schematically). As will be appreciated from FIGS. 3 and 3a, as the drive mechanism rotates the drive gear 104, that gear 104 in turn rotates the transfer gear 103, which in turn rotates the magnet gears 102a, 102b. In the illustrated embodiment, both magnet gears 102a, 102b will rotate in the same direction, which will be the opposite direction as the transfer gear 103.

The carriage 45 has a tooth bar 105 extending from the sidewall thereof. The tooth bar 105 has a series of teeth with which the teeth of the transfer gear 103 are complementarily engaged, so that as that gear 103 rotates, the carriage 45 is caused to slide laterally on the tracks 46. Referring briefly to FIG. 2, it is desirable that the rotating direction of the magnets 14a and 14b be alternated clockwise and counterclockwise, so that their poles never face each other in antipolar relation to the common poles of the frame magnets (magnetic lateral members 16 and 17) facing the target 20. (E.g. in FIG. 2, this means magnets 14a, 14b should not be oriented so that their North poles face each other toward the centerline of the apparatus). Otherwise, the tunnel-like fields 15 may be interrupted or destroyed.

In other words, the drive mechanism is operated so that the magnets 14a, 14b are rotated alternately in opposite directions, to avoid the case where they are oriented antipole toward one another in antipolar relationship with the poles of the frame magnets (16 and 17) facing the target 20. According to this manner of operation, the carriage 45 will be caused to slide laterally in one direction to a certain extent as the magnets 14a, 14b are rotated in a first direction. Then the carriage will be caused to slide laterally in the opposite direction as the magnets 14a, 14b are rotated in a second direction, opposite the first direction. It will therefore be appreciated that the lateral displacement of the carriage 45 (and therefore of magnetic end member 18) will have the same frequency as the lateral shifting (or scanning movement) of the magnetic field in the central region of the target 20, which oscillates in opposite lateral directions governed by the rotation of the magnets 14a, 14b in alternating directions. It should be noted, however, that in certain circumstances it may be desirable to completely rotate the magnets 14a, 14b so they are oriented as described above in order to temporarily disrupt the tunnel magnetic fields 15, to interrupt or disrupt the plasma. Such complete rotation may be impossible or undesirable with the tooth bar 105 operatively engaged with the transfer gear 103, because such 'over'-rotation may tend to force the carriage beyond its permissible range of lateral movement on the tracks 46. Accordingly, means may also be included to temporarily disengage the tooth bar 105 from the transfer gear 103; for example, the carriage 45 may be parked in a lowered position, so that the transfer gear 103 is no longer engaged with the tooth bar 105. When it is desired to resume normal operation, the carriage 45 can be raised into an operational position with the tooth bar 105 and the transfer gear 103 re-engaged.

Figures 4A, 4B, 4C:
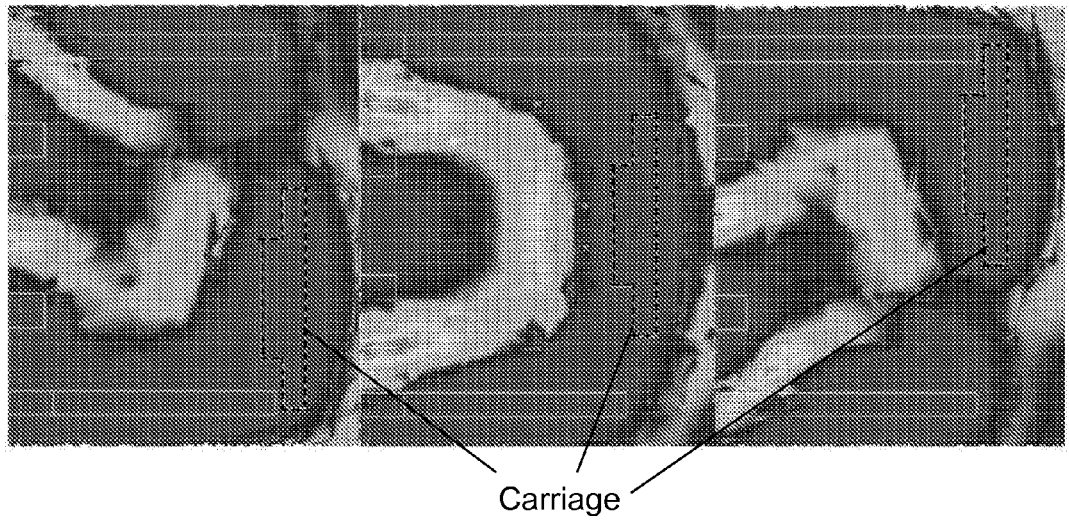
FIG. 4*a-c* show a simulation, in plan view, of the orientation of a plasma field above a target 20, in response to a modulated magnetic field according to an embodiment of the invention.

One typical target 20 has a width of 200 mm. In a preferred embodiment, the carriage 45 (and the magnetic end member 18) has a length of 100 mm extending in a lateral (width) direction relative to the target 20, and is caused to oscillate around a middle position with an amplitude of 9 mm. Other oscillatory amplitudes, e.g., 6, 7, 8, 10, 12, 14, 16, 18, 20, 25, 30, mm, etc., are also possible. In one embodiment, the oscillatory amplitude is selected based on a percentage of the target width, e.g., 4, 5, 6, 7, 8, 9, 10, 20, percent, etc. In the illustrated embodiment (FIGS. 3, 3a), the lateral sliding movement of the carriage 45 (and end member 18) is synchronous in frequency and direction with the lateral shift (scanning) of the magnetic fields 15 at the surface of the target 20. However, in a preferred embodiment, the drive mechanism 100 is configured so that the carriage 45 (end member 18) moves laterally in synchronous counter-movement (same frequency but opposite direction) in relation to the lateral shifting (scanning movement) of the magnetic fields 15 over the central region of the target 20. This can be done, for example, by interposing an additional rotary gear in between the transfer gear 103 and the tooth bar 105 illustrated in FIGS. 3 and 3*a*, as will be appreciated by those of ordinary skill in the art. This synchronous counter-movement mode of operation for the carriage 45 is shown in FIGS. 4 and 5. FIG. 4 shows a simulation, in plan view, of the orientation of plasma above the target 20 in response to a modulated magnetic field based on the synchronous counter-movement operation of the carriage 45 (magnetic end member 18) and the magnets 14*a*, 14*b* of the central magnet arrangement 14 underneath the target 20. As can be seen in FIG. 4*a*, in this simulation the end portion of the plasma loop (located in the longitudinal end region of the target) is shifted downward in the figure when the carriage 45 (shown in phantom) is in a downward position relative to the figure; at the same time, the central portion of the plasma loop is shifted upward in the figure, in response to the rotational position of the magnets 14*a*, 14*b*. Thus, the end and central portions of the plasma loop are modulated in opposite directions at the same frequency, according to the synchronous counter-movement mode of operation described above. FIG. 4*b* illustrates the system at a moment when the carriage 45 is located centrally and also the magnets 14*a*, 14*b* have been rotated halfway toward their opposite orientation from that in FIG. 4*a*. FIG. 4*c* illustrates the opposite case from Fig. 4*a*, where both the carriage 45 and the magnets 14*a*, 14*b* are oriented in their opposite extremes along their period of movement, resulting now in an upward shift of the end portion of the plasma loop above the target 20, and a downward shift in the central portion of that loop.

Figures 5A, 5B, 5C:
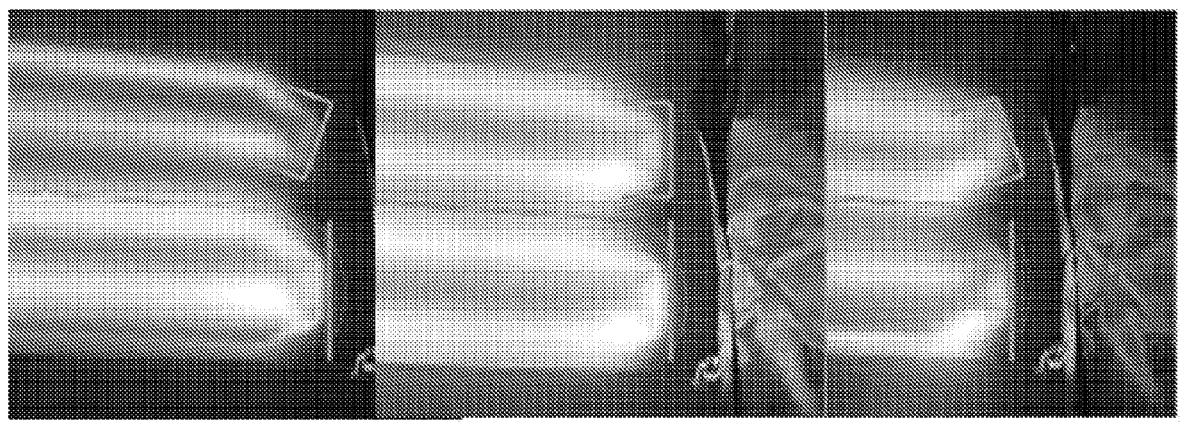
FIG. 5*a-c* show an experiment that demonstrates the effect on a plasma field in the end region of a target based on a modulated end-region magnetic field, compared to a conventional static end-region magnetic field where the plasma field in that region remains substantially static.

FIG. 5 shows photographs taken of the plasma distributions during a comparative experiment, which demonstrated the effect of modulating the magnetic field according to an embodiment of the invention. The experiment compared the plasma field modulation in response to the synchronous counter-movement mode of operation disclosed herein, with that based solely on modulation at the central region of the target 20 based only on alternate rotation of the magnets 14*a*, 14*b*. Synchronous counter-movement operation is shown in the upper images of FIGS. 5*a-c*, whereas oscillatory rotation of the magnets 14*a*, 14*b* alone (with no movement of end member 18) is shown in the lower images. Comparing the upper and lower images in these figures, synchronous counter-movement results in more complete lateral plasma scanning over the target 20 surface 22, particularly in the longitudinal end region where conventionally (as shown in the lower images) the plasma remains generally stagnant.

It is to be appreciated that the embodiment of the drive mechanism 100 described above and illustrated in FIGS. 3 and 3*a* is not limiting; the particular structure of the drive mechanism is not critical to the invention, and numerous alternative gearing configurations or alternative drive mechanism structures could be employed to achieve the desired oscillation of the magnetic end member 18 and rotation of the magnets 14*a*, 14*b*. It is well within the purview of a person of ordinary skill in the art to implement such other drive mechanisms based on the demands of a particular application (desired oscillatory frequency and amplitude, period, etc.). It is further to be understood that should a gear mechanism as above be used, a person of ordinary skill in the art will be able to determine appropriate parameters for the individual gears in order to achieve the desired degree of oscillation, rotation etc.; for example, such variables as gear diameter, tooth size and tooth pitch can be readily optimized by a person of ordinary skill in the art without undue experimentation.

The foregoing discussion with respect to lateral oscillation of the magnets in the end region of the target 20 has been provided with respect to the first magnetic end member 18. However, it will be appreciated that the same applies equally to the lateral oscillation of the magnets in the opposite longitudinal end region, namely to the second magnetic end member 19. If a similar drive mechanism 100 is provided at both ends of the rotary magnets 14*a*, 14*b*, then the first and second magnetic end members 18 and 19 can be oscillated in similar fashion as explained above, through operative coupling to the adjacent drive mechanism. Alternatively, if a drive mechanism is provided at only one end of the magnets 14*a*, 14*b*, then additional linkages or gears may be used to link the opposite magnetic end member 19 to the drive mechanism 100. Alternatively, one or both of the magnetic end members 18 and 19 may be independently actuated, apart from the drive mechanism that drives the rotary magnets 14*a*, 14*b*, to achieve oscillation of the desired period and amplitude. If independent actuation means are used, then suitable means (such as a computer controller or microcontroller) can also be used to ensure proper frequency and phase of the oscillation of the end members 18 and 19 to ensure they are synchronous (co- or counter-movement) with respect to oscillatory rotation of the rotary magnets 14*a*, 14*b* if desired.

The magnetic end members 18 and 19 can be provided as permanent magnets disposed in a carriage 45, as shown schematically in FIG. 3. The magnetic induction of these magnets desirably is in the range of those magnets used in the magnetic lateral members 16 and 17 disposed adjacent the long edges of the target 20. Also the polarity of the magnets in the lateral members 16 and 17 and the end members 18 and 19 are the same. In a chosen setting, this magnetron configuration generates a magnetic field over the target of about 350 G. Of course, the specific design in terms of magnetic strength and number of magnets in the carriage 45 or in the lateral members 16 and 17 are subject to changes or optimization based on the particular application or target material, size, dimensions, etc., and can be selected by the person skilled in the art.

In another embodiment, the carriage(s) 45 located underneath the longitudinal end regions of the target 20 can be moved or oscillated in a direction parallel to the long axis of the target, instead of or in addition to the lateral oscillation discussed above. If such longitudinal oscillation of the carriage 45 is to be achieved in phase with the rotational oscillations of the magnets 14*a*, 14*b* using a common drive mechanism 100, then different power transmission structure would be required to transform rotation of the gears about a longitudinal axis (e.g. transfer gear 103) into longitudinal translation movement along the axis of rotation: e.g. a cone planetary gearing mechanism, which is known in the art (not shown). Again, the exact structure of the power transfer/drive mechanism is not critical to the invention, and its implementation is well within the purview of a person of ordinary skill in the art without undue experimentation.

Alternatively to pure lateral and/or longitudinal oscillations/movements of the magnetic end members 18 and 19, any other movement (such as along a circular or curvilinear or diagonal path, or combination of these) under the longitudinal end regions of the target 20 is also contemplated to produce an improvement over the conventional, stationary magnets in these regions. This is because conventionally the magnets in these regions are stationary. Therefore, the magnetic field (and consequently the plasma field) above the longitudinal end regions of the target is stagnant, meaning that the path of erosion of the target surface is stagnant. This produces highly-focused erosion of the target, forcing replacement of the target 20 earlier than would be warranted based on erosion of the vast majority of its surface area (central region). Therefore, any movement in the longitudinal end regions that will produce a modulation in the magnetic and plasma fields above the target will have the effect of widening the focus of erosion in the end regions of the target 20, therefore extending its useful lifetime. While lateral oscillation described above is one embodiment for achieving this, any modulation of the fields in the longitudinal end regions of the target should produce an improvement in terms of broadening the focus of erosion in those regions. Beside moving magnets, a yoke or combinations of a yoke and magnets could be introduced to give a means of magnetic field modulation. The effect can be seen in the simulation (FIG. 4). It is also seen in FIG. 5, which compares the plasma scan over the target 20 based on the present design where plasma is modulated over both the central and end regions of the target (upper images), with the conventional design where plasma is scanned over the central region only and is static in the end region. As noted above, the introduction of magnetic modulation in the end regions spreads the erosion over a larger area in the end regions. This decreases the local erosion depth spot in the longitudinal end regions, thereby increasing the target utilization.

According to sputter tests, the invention can increase the target utilization of the conventional design cathode, which is typical around 30 to 35%, to 40 to 45%, creating exceptional additional value by eliminating substantial waste of target material.

Figure 6:
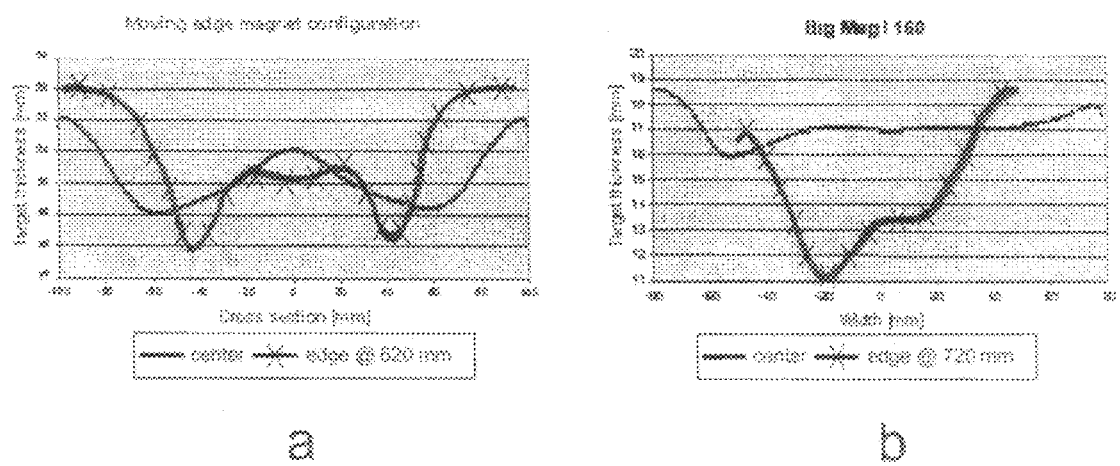
FIGS. 6*a* and 6*b* show a comparison of the erosion profiles of two targets, one eroded according to a conventional operation where the end-region magnetic field is substantially static (FIG. 6*b*), and the other eroded according to an embodiment where the end-region magnetic field is modulated (FIG. 6*a*).

FIGS. 6*a-b* show a comparison of the erosion profiles for a location at the central region (dark line) and a location at the longitudinal end regions of a target 20, based on modulating the magnetic field in the end regions as described herein, versus stagnant magnetic fields in the end regions as is conventional. FIG. 6*a* illustrates a depth profile using the present design, and FIG. 6*b* illustrates a depth profile using the conventional design. The ratio between the deepest erosion points at the end regions and the center region is a reliable indicator for the target utilization, the value 1 describing an ideal depth ratio. The erosion profiles were made for respective targets using a modulated end-region magnetic field as described herein (FIG. 6*a*) as well as a conventional stagnant end-region magnetic field (FIG. 6*b*) to generate the data in these figures. The results for the conventional configuration (6*b*) show that end-region erosion is far deeper than the center-region erosion, limiting the target lifetime. In contrast, the end-region erosion of the modulated-field end-region configuration is only slightly deeper than the central region erosion, thereby increasing the target lifetime and the target utilization. As the end regions are only a very small portion of the total target area, even a minor increase in the local target utilization in the end regions will give a large leverage for the total target utilization of the entire target 20. Because the static magnetic field is kept constant (the strength of the magnets, and therefore of the magnetic field, are unchanged) and only a modulation is introduced, the erosion in the central region is not affected. The plasma properties and in turn the film deposition properties can be maintained at a high quality.

Figure 7:
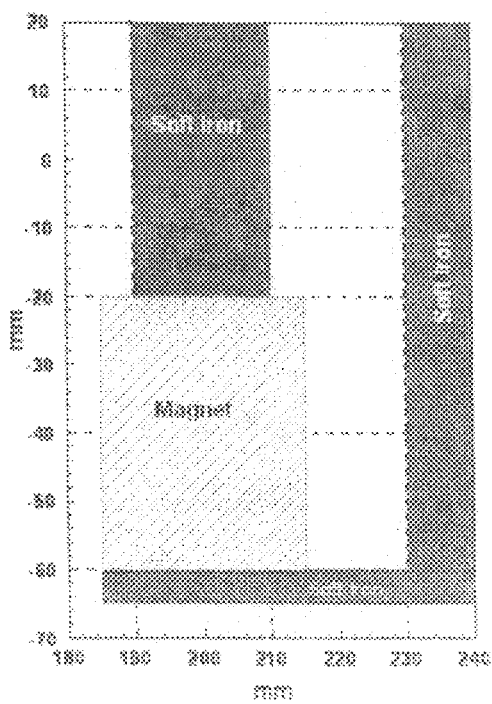
FIG. 7 shows a schematic cross-section side of an electromagnetic coil for producing a modulation in a magnetic field according to an embodiment described herein.

Magnetic field modulation discussed above has been described primarily based on using permanent magnets and moving them around in the longitudinal end region of the target 20. Alternatively, however, a similar effect could be reached by the modulation of the magnetic field with electromagnetic modulation using a magnetic field from a coil situated in the area of the longitudinal end regions of the targets. FIG. 7 shows a schematic section view from the side through the middle axis of such a coil. The number of coil windings as well as size and form of the soft iron core may be selected by a person of ordinary skill in the art based on art-recognized principals depending on how strong a field is desired, available power and voltages, etc.

Comparing experimental erosion pattern results based on modulation of end-region magnetic fields (FIG. 6*a*) with the mathematical model for the plasma distribution based on the oscillation of the magnetic end members 18, 19 (simulation illustrated in FIG. 4), we have concluded that the mathematical simulation of the magnetic (and therefore plasma) field oscillations is able to reliably predict the resulting real erosion pattern on targets 20. The magnitude of the modulation is large enough to influence the magnetic field at the target surface 22 to alter the plasma pathways and in turn to influence the erosion pattern. In a chosen configuration the magnetic field strength on top of the target modulates around a mean value of about 200 G, the amplitude being in the range of 100-150 G.

In addition to more uniform use of the target source material, an additional advantage of the invention is that stepped targets are not required to improve the utilization of the whole target because the longitudinal end regions will be eroded more uniformly compared to the central region, meaning a greater proportion of the central region material can be harvested before the target is replaced. This reduces the cost of the material cost for the targets significantly by maintaining or even increasing the overall target lifetime.

The invention can be used for a broad band of larger area coating applications to apply a thin-film sputter coating (of the target source material that is removed from the target 20 via the plasma) to substrates ranging from, for example, flat panel displays, solar cells, to architectural glasses. Semiconductor applications or surface treatment of other large objects are also within the scope of the invention. The invention can be used in or as a single cathode, in so called inline type coating applications, as well as a part of a multiple-cathode target source.

It will be evident from the foregoing that the invention involves modulating the magnetic field above the longitudinal end regions of the target 20, where conventionally the magnetic field was otherwise relatively static or stagnant. Herein, at least one embodiment for achieving end-region modulation of the magnetic field has been described. However, having identified the problem and at least one practical solution herein, a person of ordinary skill in the art will be able to devise other modes and means for modulating the magnetic field in the end regions of the target. Accordingly, methods of the present invention, to modulate the magnetic field in the end region(s) of the target, are not to be limited to using solely the disclosed structure or apparatus, as others will be apparent to those skilled in the art.

Although the invention has been described with respect to certain preferred embodiments, it is to be understood the invention is not to be limited thereby. Numerous modifications can be made thereto, which will be evident to a person of ordinary skill in the art upon reading this disclosure, for example to adapt the present teachings to a specific application, or to a particular target material, without departing from the spirit and the scope of the invention as set forth in the appended claims.

What is claimed is:
1. A sputtering apparatus comprising:
a magnetic assembly with an outer magnet frame surrounding a central magnetic arrangement, said outer magnet frame including first and second longitudinally extending magnetic lateral members located on either side of the central magnetic arrangement, and first and second magnetic end members located at and defining opposite longitudinal ends of said frame;

a rectangular sputter target disposed over said magnetic assembly during operation, said sputter target having a central region, first and second longitudinal end regions, and a long axis, said magnetic assembly being effective to generate a magnetic field above the sputter target, with said central magnetic arrangement of the magnetic assembly being movable with respect to said outer magnet frame and being effective to produce a non-static modulation in said magnetic field above said central region of said target;

said first and second magnetic end members being movable perpendicular to the long axis of the target in at least a first direction relative to said first and second longitudinally extending lateral members and being effective to produce a nonstatic modulation in said magnetic field above said first longitudinal end region of said target.

2. The sputtering apparatus according to claim 1, said central magnetic arrangement comprising a pair of oppositely polar-oriented and longitudinally-extending permanent magnets that are rotatable about their respective longitudinal axes, which are thereby effective to cause a lateral shift in said magnetic field above said central region of said target.

3. The sputtering apparatus according to claim 1, said first magnetic end member being operatively coupled to said movable central arrangement, so that said first magnetic end member will move synchronously with the movable central arrangement, thereby producing synchronous modulations of said magnetic field above said central region and said first end region of said target.

4. The sputtering apparatus according to claim 2, said first magnetic end member being operatively coupled to said rotatable magnets so that said first magnetic end member will oscillate at the same frequency and in phase with the rotation of said rotatable magnets as they are rotated alternately in opposite directions, thereby producing in-phase modulations of said magnetic field above said central region and said first end region of said target.

5. The sputtering apparatus according to claim 4, said first magnetic end member and said rotatable magnets being operatively coupled to achieve synchronous counter-movement between said first magnetic end member and oscillatory lateral shifting of said magnetic field above said central region.

6. The sputtering apparatus according to claim 1, said first magnetic end member comprising a permanent magnet that is adapted to be moved at least laterally or longitudinally relative to said target.

7. The sputtering apparatus according to claim 6, said permanent magnet being supported on a carriage that is slidable laterally on at least one track.

8. The sputtering apparatus according to claim 1, said first magnetic end member comprising an electromagnet, wherein magnetic field modulation can be achieved by modulating the power or voltage supplied to said electromagnet.

9. The sputtering apparatus according to claim 1, comprising a plurality of said magnetic assemblies, to accommodate a plurality of said targets.

10. A sputtering method comprising the steps of: providing a sputtering apparatus according to claim 1;
generating a magnetic field above a surface of the target of said sputtering apparatus;
directing a plasma toward said target surface via said magnetic field, said plasma eroding said target surface; and
modulating said magnetic field above said first end region of said target surface relative to said first and second longitudinally extending lateral members, thereby widening a focus of erosion of said target in said first end region thereof.

11. The sputtering method according to claim 10, said target being or forming part of a cathode, said method further comprising applying a voltage between said cathode and an anode located above and spaced apart from said target surface to generate an electric arc discharge therebetween, thereby generating said plasma from an inert gas that is present between said cathode and said anode.

12. The sputtering method according to claim 10, wherein the magnetic field is modulated such that a portion thereof located above said first end region of said target surface is shifted in a first lateral direction when another portion thereof located above said central region of said target surface is shifted in a second lateral direction, opposite from the first lateral direction.

13. The sputtering method according to claim 10, said magnetic field above said target surface being in the form of a tunnel magnetic field that is generated beneath and penetrates said target, said tunnel magnetic field having a ring- or oblong ring-shape when viewed from above.

14. The sputtering apparatus of claim 1, wherein the first and second longitudinally extending magnetic lateral members are fixed and not movable relative to the target.

* * * * *

UNITED STATES PATENT AND TRADEMARK OFFICE
CERTIFICATE OF CORRECTION

PATENT NO.       : 8,273,221 B2
APPLICATION NO.  : 11/638176
DATED            : September 25, 2012
INVENTOR(S)      : Stefan Schneider et al.

It is certified that error appears in the above-identified patent and that said Letters Patent is hereby corrected as shown below:

In the Specifications:

In column 3, line 59 insert -- ) -- after thereof

Signed and Sealed this
Fourth Day of June, 2013

Teresa Stanek Rea
*Acting Director of the United States Patent and Trademark Office*